US007310237B2

(12) United States Patent
McEwan et al.

(10) Patent No.: US 7,310,237 B2
(45) Date of Patent: Dec. 18, 2007

(54) DEVICE FOR SECURING A CIRCUIT BOARD TO A SOCKET

(75) Inventors: John Arthur McEwan, Alexandria, VA (US); James Stewart McEwan, Great Falls, VA (US); David A. Yates, Falling Waters, WV (US)

(73) Assignee: Technology Advancement Group, Inc., Dulles, VA (US)

( * ) Notice: Subject to any disclaimer, the term of this patent is extended or adjusted under 35 U.S.C. 154(b) by 0 days.

(21) Appl. No.: 11/008,572

(22) Filed: Dec. 10, 2004

(65) Prior Publication Data

US 2006/0128200 A1 Jun. 15, 2006

(51) Int. Cl.
*H05K 5/00* (2006.01)

(52) U.S. Cl. ...................... 361/759; 361/610; 361/736; 361/740; 361/747; 361/732; 439/160; 439/368; 439/327

(58) Field of Classification Search ................ 361/610, 361/736, 740, 747, 759, 732; 439/368, 327
See application file for complete search history.

(56) References Cited

U.S. PATENT DOCUMENTS 3,829,741 A * 8/1974 Athey ........................ 361/756
4,089,042 A * 5/1978 Torburn ...................... 361/784
4,109,300 A * 8/1978 Reimer ....................... 361/801
4,158,876 A 6/1979 Pedro
4,198,024 A * 4/1980 Cavanna ..................... 248/544
4,509,810 A * 4/1985 Erlam et al. ............... 439/76.1
5,259,783 A * 11/1993 Hileman et al. ............ 439/372
5,383,793 A * 1/1995 Hsu et al. ................... 439/327
5,603,628 A * 2/1997 Schapiro, Jr. ............... 439/327
5,650,917 A * 7/1997 Hsu ........................... 361/759
5,754,406 A * 5/1998 Hardt et al. ................ 361/756
5,810,613 A * 9/1998 Ati et al. .................... 439/157
5,822,193 A * 10/1998 Summers et al. ........... 361/759
5,943,218 A * 8/1999 Liu ............................ 361/801
5,980,295 A * 11/1999 Lai et al. .................... 439/327
5,996,962 A * 12/1999 Chang et al. ............... 248/694
6,021,049 A 2/2000 Thompson et al.
6,027,358 A * 2/2000 Lai et al. .................... 439/327
6,045,386 A 4/2000 Boe
6,171,120 B1 1/2001 Bolich et al.
6,195,266 B1 * 2/2001 Padgett et al. .............. 361/799
6,210,195 B1 4/2001 Ma
6,229,709 B1 5/2001 Hardt et al.

(Continued)

*Primary Examiner*—Dean A. Reichard
*Assistant Examiner*—Hoa C Nguyen
(74) *Attorney, Agent, or Firm*—Marc W. Butler; Nixon Peabody, LLP

(57) ABSTRACT

The present invention provides a securing device for securing a card to a socket within a computer is provided where the card and the socket are coupled. The device includes a unitary base member comprising a foundation portion dimensioned to receive a stationary socket and an arm portion orthogonally positioned relative to the foundation. A first engaging means is formed on at least one side of the arm member. The device also includes a clasp assembly that includes an opening for slideably receiving the arm portion of the unitary base member, a recess for receiving a non-connecting end of a card, and a second engaging means for securely engaging the first engaging means. The clasp assembly secures the card to the socket with the socket received in the foundation portion and edge of the card is received in the recess.

28 Claims, 14 Drawing Sheets

U.S. PATENT DOCUMENTS 6,312,279 B1 * 11/2001 Rachui et al. .............. 439/377
6,331,940 B1 12/2001 Lin
6,430,041 B1 8/2002 Johnson et al.
6,517,369 B1 2/2003 Butterbaugh et al.
2003/0032334 A1 2/2003 Johnson et al.

* cited by examiner

DEVICE FOR SECURING A CIRCUIT BOARD TO A SOCKET

BACKGROUND OF THE INVENTION

1. Field of the Invention

The present invention relates generally to devices for securing a circuit board to a socket for electrical connection. In particular, an exemplary embodiment of the present invention relates to a clamping device for securing a circuit board within a socket of a computer bus.

2. Background

FIG. 1A illustrates a conventional circuit board 100 situated for placement into a connector socket 140 located on a baseboard 110, such as a "motherboard", of a computer. The circuit board 100 includes circuit elements 120 (i.e., processors, resistors, capacitors, or the like) and can also include one or more plug connectors 160 for external connection connected through a mounting bracket 150. The typical circuit board 100 includes one or more connectors 130 and 130' (connector 130 shown with electrically conductive leads 135) shown slightly elevated from the connector socket 140 (hereinafter "socket") which is the mate for connector 130. While connector 130' is shown as a pronged connector, other types of connectors could also be employed.

FIG. 1B shows an end view of the conventional circuit board 100 shown in FIG. 1A, with the circuit board 100 (shown in dashed lines) and associated connector 130 (not shown) inserted into the socket 140. Specifically, this view illustrates how the additional connector 130' is able to provide additional circuit connections. A connector 170 can be connected to the connector 130' and provided to other elements in the computer via a ribbon cable or the like.

Proper positioning of circuit boards, like the one illustrated in FIGS. 1A and 1B, firmly within sockets of computers is vital to efficient operation of the computer. Normally, a plurality of circuit boards, such as interface cards, are placed as securely as possible, into sockets (i.e., electrical connectors) that are electrically connected to other elements within the computer that enable the computer, via a communications bus or the like, to properly operate. Nearly all computers have numerous sockets that enable manual placement of various circuit boards within the computer. The plurality of sockets allow, for example, a computer owner to "upgrade" a computer's processing capability, modem, display capabilities etc., by merely exchanging one circuit board for a newer updated circuit board.

While the use of numerous sockets enables an efficient and cost effective way of upgrading a computer, this increases the possibility of computer malfunction due to improperly seated circuit boards. For example, a circuit board can become lose due to vibration or shock and be damaged or fail to achieve reliable electrical connection.

Additionally, the constant miniaturization processing chips and thus the reduction of the space required for PC boards has positive spatial effects but can lead to problems associated with excessive heat generation by components. With regard to circuit boards, the constant heating and cooling of the circuit boards, especially in the continual reduction of space for placement of circuit boards, leads to the loosening of the fit of the board in the socket. As a result, even a minor movement of the computer can cause disconnection of a circuit board and malfunction of the computer. Finally, as more components are placed on PC boards, the length of the board is often extended. Accordingly, the weight of the board can cause a torque on the card that tends to cause the card to be unseated from the socket.

There have been numerous attempts to solve such problems through the employment of a support mechanism to reduce the chances that the circuit board will break off at the connector or fall out of positioning within the socket. For example, U.S. Pat. No. 5,383,793 to Hsu, discloses an adjustable height and position retainer for releasably retaining a printer circuit card in a circuit card edge connector. The retainer comprises an elongated base member for attachment to the side of a circuit card edge connector, an elongated retaining post, and a clamp assembly slideably attached to the retaining post and positionable at any selected position along the length of the retaining post.

This device however, is impractical for several reasons. For example, the device includes a base having separate pieces. This reduces the effectiveness of the card retainer in several ways. Initially, as indicated by the open ends in the elongated base member, this can lead to the post falling away from the base thereby rendering the retainer ineffective. Additionally, since the post is moveable with regard to the base, ineffective retaining of the circuit board can result, if for example, the post is installed in a non-orthogonal manner with respect to the circuit board. Moreover, the device is very complex and is not easy to use. For example, the clamping device requires at least two fingers of a hand to properly release the clamping device as two levers are required to be released from separate sets of teeth.

U.S. Pat. No. 5,996,962 to Chang discloses card retainer having a holder body including a slot which rests against an outer edge of a circuit board. The holder body has a channel into which a post is inserted. The post has a series of teeth which form a ratchet with a pawl. A pair of leaf springs having a head is attached to the top of the post. The leaf spring provides an outward bias to the head against the inner surface of the central processing unit cover which urges the circuit board to the edge connector. To assure that the holder body stays in a desired position on the circuit board, a pair of tie down straps which pass through the holder body and around the inside of the circuit board are provided. This device, like the device described in U.S. Pat. No. 5,383,793, has deficiencies in that it provides a complicated and mechanically intensive device to restrain circuit boards. For example, this device relies upon the cover for securing a circuit card. Any movement (i.e., through shifting, buckling or bending) of the cover impacts effectiveness of the card retainer.

U.S. Pat. No. 5,603,628 to Schapiro, Jr. discloses a card retainer device which utilizes a pair of tie members which connect to anchors located on or attached to the card housing bus. The anchors can be fabricated directly into the bus connectors into which computer cards are contemplated to be installed. This device also has several disadvantageous effects. The retainer device requires a special connecter having catches to secure an end of the card retainer device. Additionally, the device is difficult to pull tight between boards that are closely arranged. Moreover, the edge of the circuit board could wear against the strap and cause damage to both the card and the strap.

SUMMARY OF THE INVENTION

Accordingly, what is needed is a device that offers practical advantages over the prior art, including a simpler clasp design and engagement mechanism which can be manufactured at reduced costs and adopted for use with all conventional connectors and cards.

In accordance with an exemplary embodiment of the present invention, a securing device for securing a card to a socket within a computer is provided where the card and the socket are communicatively coupled. The device includes a unitary base member comprising a foundation portion dimensioned to receive a stationary socket and an arm portion orthogonally positioned relative to the foundation. A first engaging means is formed on at least one side of the arm member. The device also includes a clasp assembly that includes an opening for slideably receiving the arm portion of the unitary base member, a recess for receiving a non-connecting end of a card, and a second engaging means for securely engaging the first engaging means. The clasp assembly secures the card to the socket with the socket received in the foundation portion and edge of the card is received in the recess.

In accordance with a further exemplary embodiment of the present invention, further comprising a second arm portion orthogonally positioned relative to the foundation is provided where teeth are formed on at least one side of the second arm member. Additionally, the device further comprises a second clasp assembly including an opening for slideably receiving the second arm portion of the unitary base member.

In accordance with another exemplary embodiment of the present invention, a securing device for securing a card to a socket within a computer is provided where the card and the socket are communicatively coupled. The device includes a unitary base member comprising a foundation portion and an arm portion orthogonally positioned relative to said foundation. A first engaging means is formed on at least one side of the arm member. The device includes an affixing element to attach the foundation portion of the unitary base member to the socket. The device also includes a clasp assembly that includes an opening for slideably receiving the arm portion of the unitary base member, a recess for receiving a non-connecting end of a card, and a second engaging means securely engaging the first engaging means. The clasp assembly secures the card to the socket with the socket attached to the foundation portion and edge of the card is received in the recess.

In accordance with another exemplary embodiment of the present invention, an article of manufacture is provided. The article of manufacture includes a unitary base member comprising a foundation portion and an arm portion orthogonally positioned relative to said foundation. A first engaging means is formed on at least one side of said arm member an affixing element to attach the foundation portion of the unitary base member to the socket. Each of a plurality of clasp assemblies comprise an opening for slideably receiving the arm portion of said unitary base member and a second engaging means for securely engaging said first engaging means, wherein said clasp assemblies attach to the unitary base member.

In accordance with a further embodiment of the present invention, a ridge, formed at the juncture of the arm and the foundation is provided that facilitates orthogonal positioning of the securing device on the side edge of a card socket.

BRIEF DESCRIPTION OF THE DRAWINGS

The above and other aspects, features and advantages of this invention will be described in relation to the following figures in which like reference characters refer to the same parts throughout the different views.

DETAILED DESCRIPTION

An exemplary embodiment of the present invention relates to a securing device. Although specific embodiments will be illustrated and described herein with regard to securing a circuit card to an edge connector, such as a bus connector, motherboard socket, or the like, in environments subject to physical vibration and shock, it should be appreciated by those of ordinary skill in the art that such a system and method would also be advantageous, for example, in applications in which any card-type element needs to be secured. Additionally, this application is intended to cover any adaptations or variations of the present invention that generally relate to securing circuit boards.

In the following detailed description of the exemplary embodiments, reference is made to the accompanying drawings that form part hereof, and in which is shown by way of illustration, specific exemplary embodiments in which the invention may be practiced. These embodiments are described in sufficient detail to enable those skilled in the art to practice the invention, and it is to be understood that other embodiments may be utilized and that logical, mechanical and/or electrical changes may be made without departing from the spirit and scope of the present invention. The following detail description is therefore not to be taken in a limiting sense.

Figure 1A:
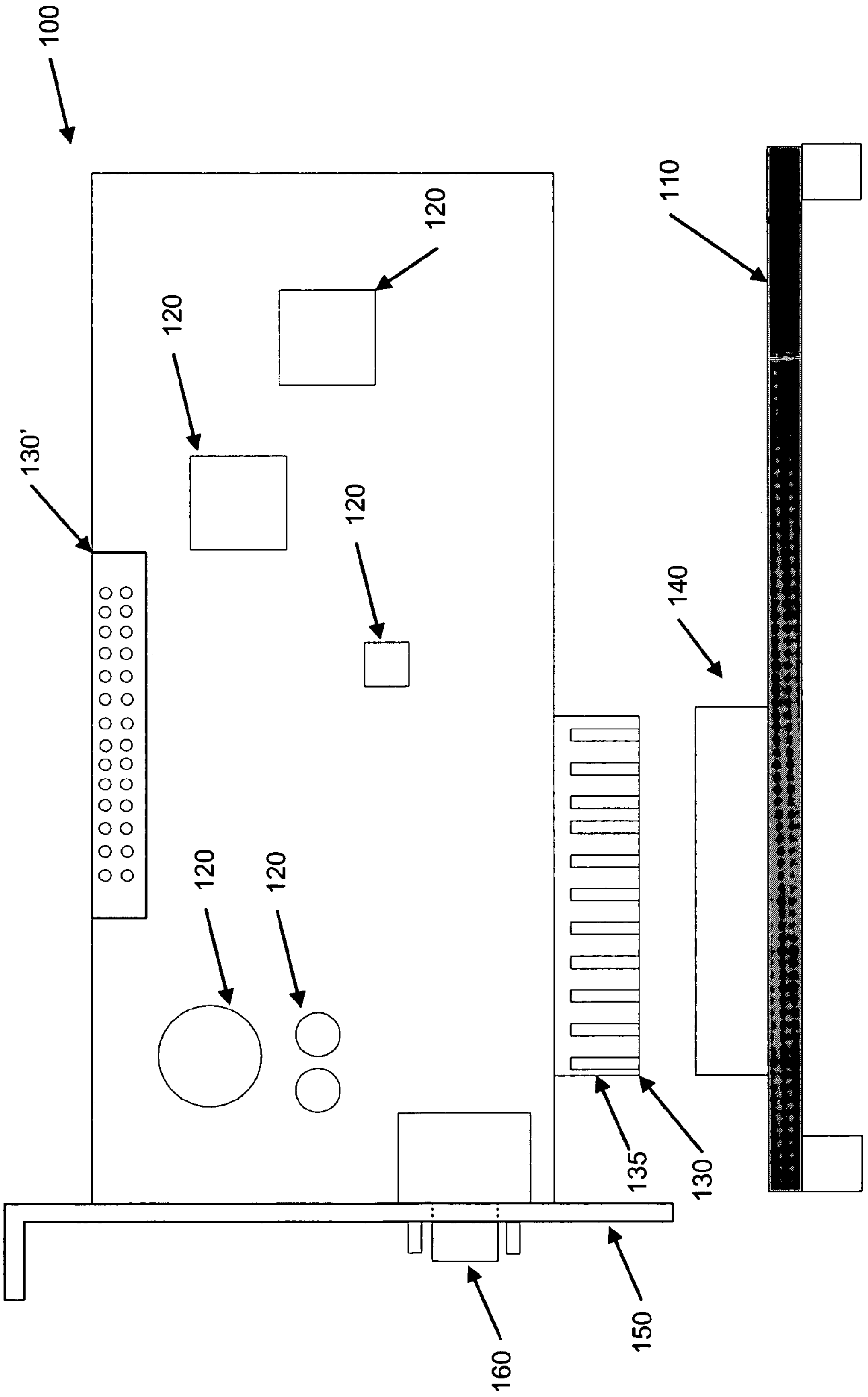
FIG. 1A PRIOR ART
FIG. 1A is a view of a circuit board and connector socket of a known computer system.
Figure 1B:
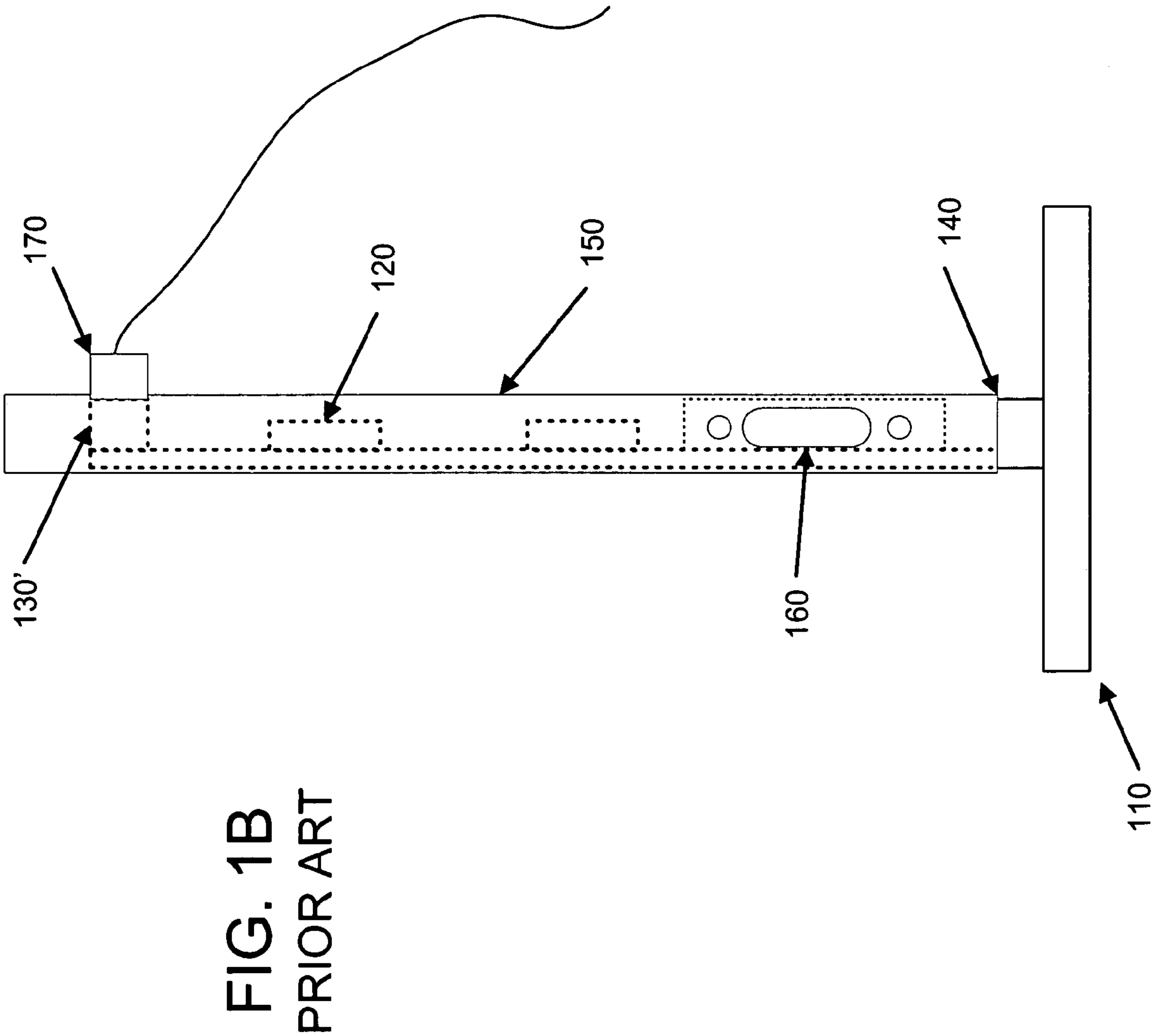
FIG. 1B PRIOR ART
FIG. 1B is a end view of a circuit board and connector socket of a known computer system.
Figure 2:
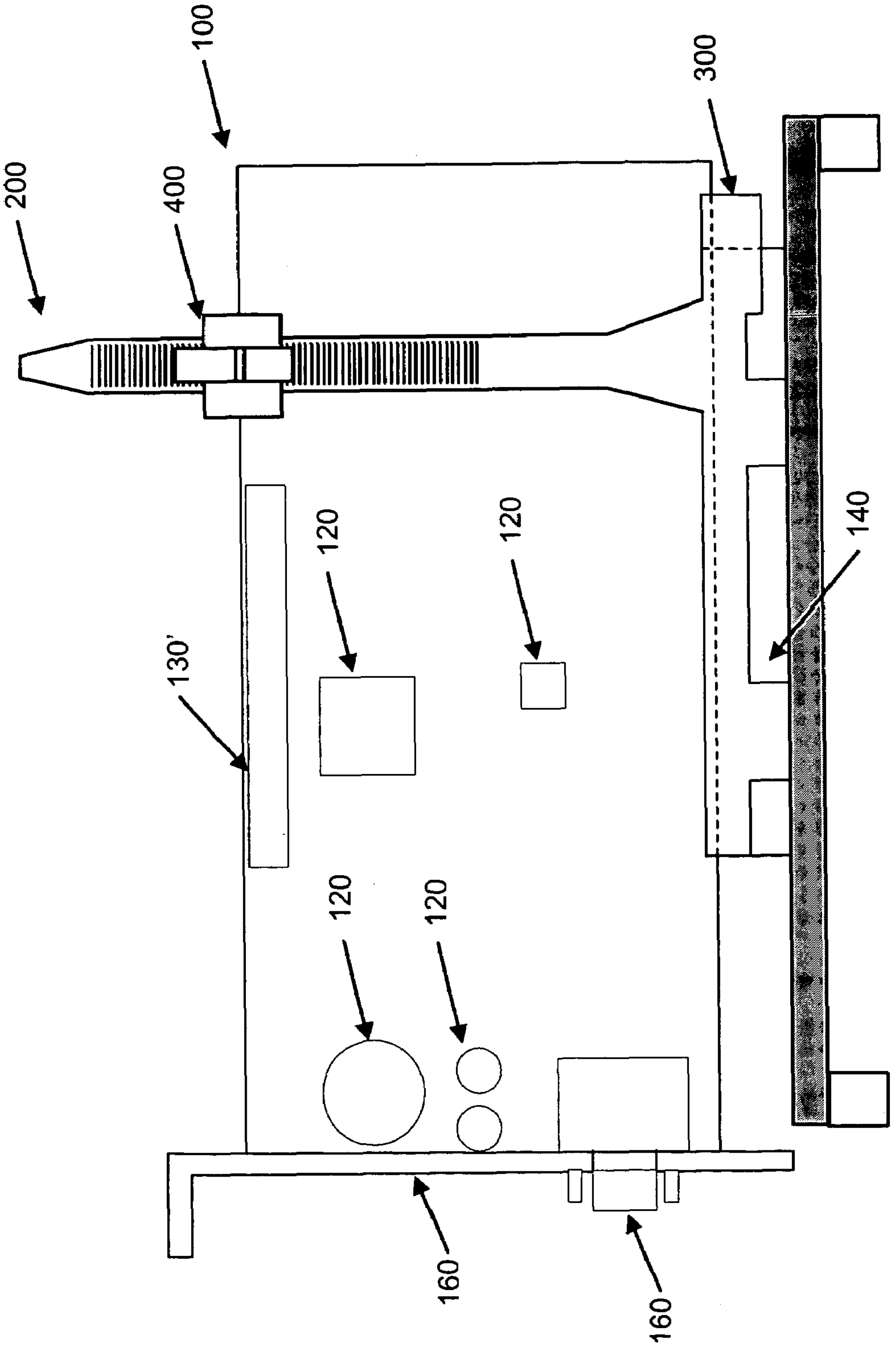
FIG. 2 is a view of a circuit board that is held to the socket by the securing device in accordance with an exemplary embodiment of the invention.

FIG. 2 illustrates a view of a circuit board 100 in which the connector 130 (illustrated in FIG. 1) is held in place within socket 140 and by a securing device 200, provided in accordance with an exemplary embodiment of the invention. The securing device 200 includes of a base unit 300 and a clasp assembly 400, which is removable and repositionable.

Figure 3A:
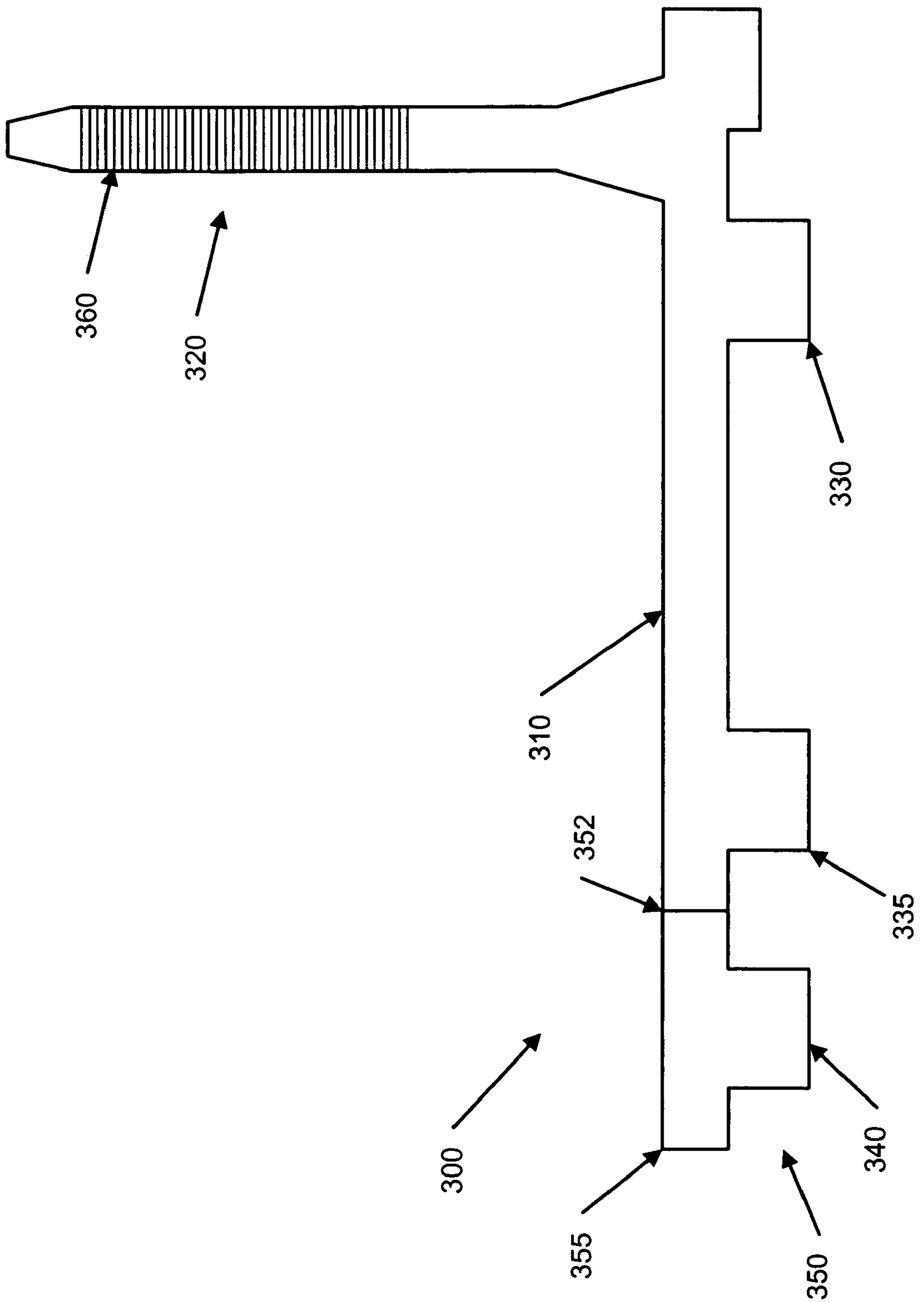
FIG. 3A is a view of the base unit of the securing device shown in FIG. 2.
Figure 3B:
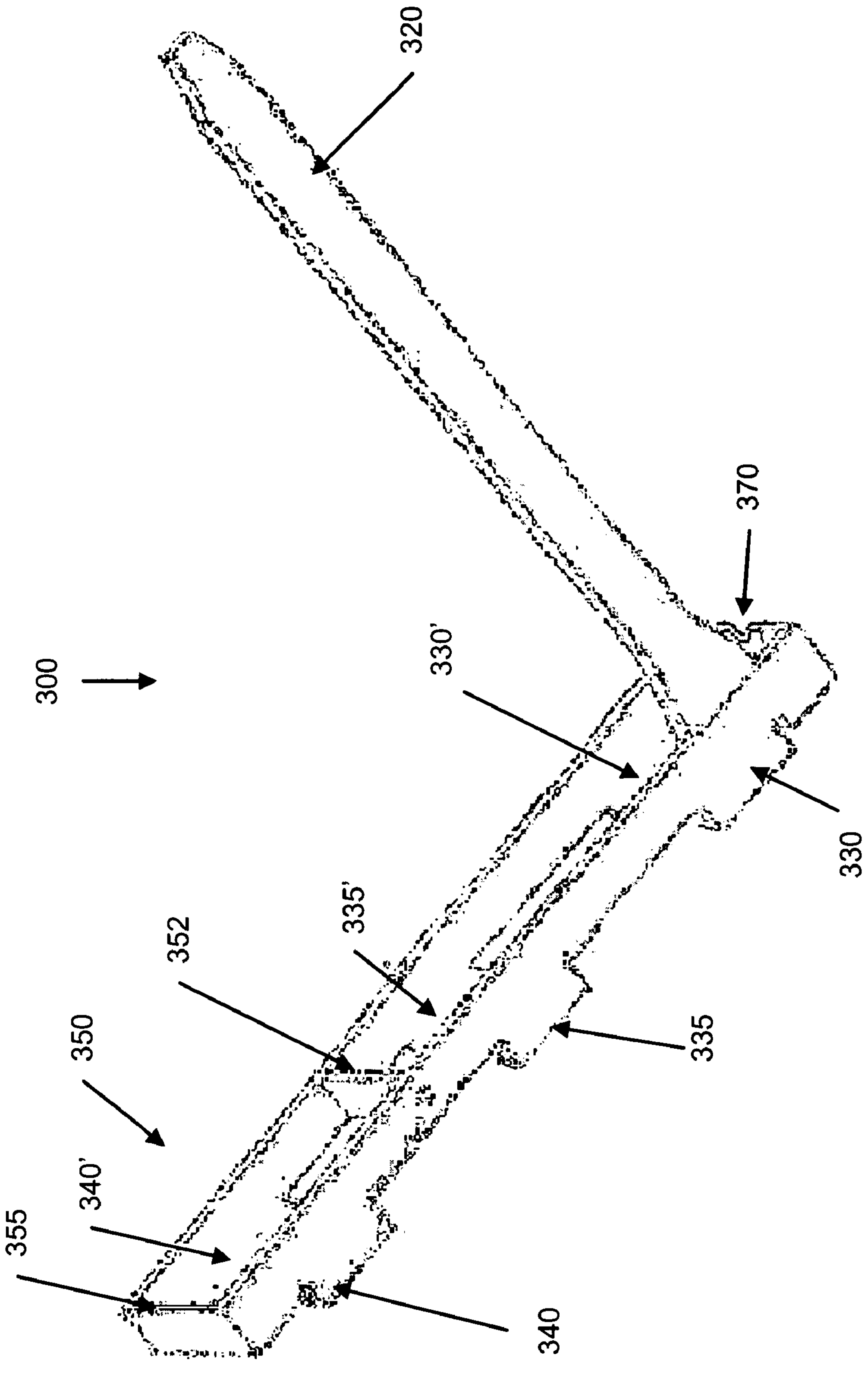
FIG. 3B is a perspective view of the base unit of the securing device shown in FIG. 2.

As illustrated in more detail in FIGS. 3A and 3B, the base unit 300 of the securing device 200 includes a foundation 310 and an orthogonally extending arm 320 attached to the foundation 310. The foundation 310 and the arm 320 can be formed as a unitary structure that comprises the unitary base unit 300. The unitary characteristic of the base unit, manufactured using any well known molding procedure, provides a sturdy and strong support structure which can provide support for a circuit board 100. Additionally, the unitary securing device 200 can be made of any sturdy material such as plastic (e.g., PVC material or the like), so long as the material does not adversely affect the normal electrical operation of the circuit board and computer.

The foundation 310 also includes tabs 330, 335 and 340 (illustrated in FIG. 3A) and tabs 330', 335' and 340' (illustrated in FIG. 3B showing a perspective view of the base unit 300) as well as an end cross element 352, at least one sizing element 350 and a notch 370 (illustrated in FIG. 3B). The arm 320 includes a plurality of teeth 360 extending horizontally across the arm 320 in a stacked fashion along a portion of the length of the arm 310 provided for reception and interlocking with the clasp assembly 400.

Figure 3C:
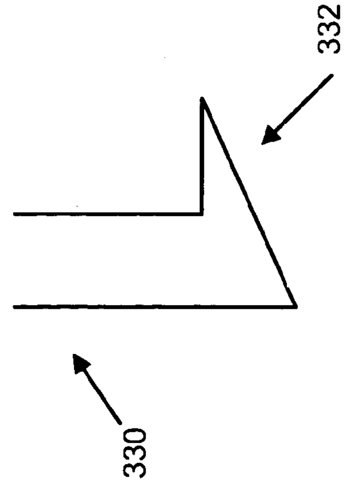
FIG. 3C is a side view of the tabs employed in the base unit of the securing device shown in FIG. 2.

The tabs 330, 330', 335, 335', 340 and 340' of the foundation 310 are rectangular elements attached (in a unitary fashion) to the bottom of the foundation that each include a pawl to securely wrap around the bottom edge of a socket and provide additional support for the securing device 200. As illustrated in FIG. 3C each tab includes a pawl that is able to fit under the bottom edge of a socket 140 to provide further support for the securing device. FIG. 3C illustrates tab 330 and pawl 331, which are exemplary of the remaining tabs in located on the foundation.

Figure 5:
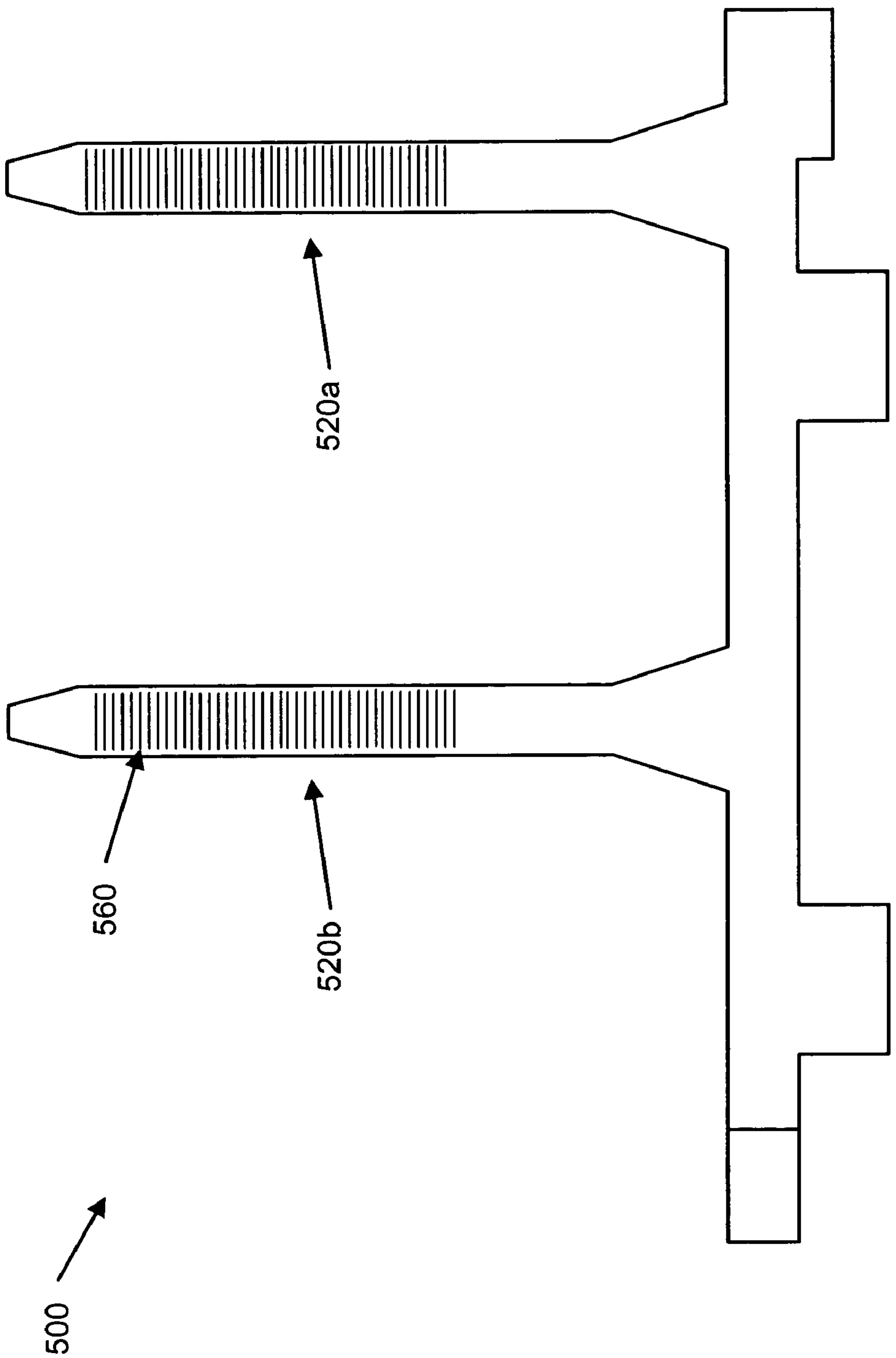
FIG. 5 is a view of a base unit of a securing device in accordance with another exemplary embodiment of the invention.

The sizing element 350 of the foundation 310 includes a cross element 355. The sizing element can optionally include a tab as illustrated in FIGS. 3A and 3B. Additionally, the sizing element need not include a tab as illustrated in FIG. 5. While a single sizing element 350 is shown in FIG. 5, the securing device of the present invention can be manufactured with additional sizing elements so as to accommodate different connectors. The sizing portion 350 provides an ability for the foundation to be modified to fit around multiple different sized sockets 140. If, for example, a socket 140 is small in size, the sizing element 350 and cross element 355 can be manually removed to enable the base unit 300 to more easily fit within the computer. Specifically, a knife, or the like, can be employed to remove the sizing element 350 at the end cross element 352. If a socket is larger in size, the end cross element 352 can be removed thereby enabling the base unit to fit the larger socket. Again, a knife or the like can be employed to remove the end cross connect 352. Moreover, the foundation can be produced so as to include multiple sizing elements attached at the end cross connect 352. A notch 370, located on an and of the base opposite to the sizing element 350, provides a recess for any section of the circuit card 100 that extends below the top edge of the socket 140. Additionally, notches, breakaways other mechanisms can be provided to permit easy removal of the sizing elements and/or cross end elements.

Figure 4:
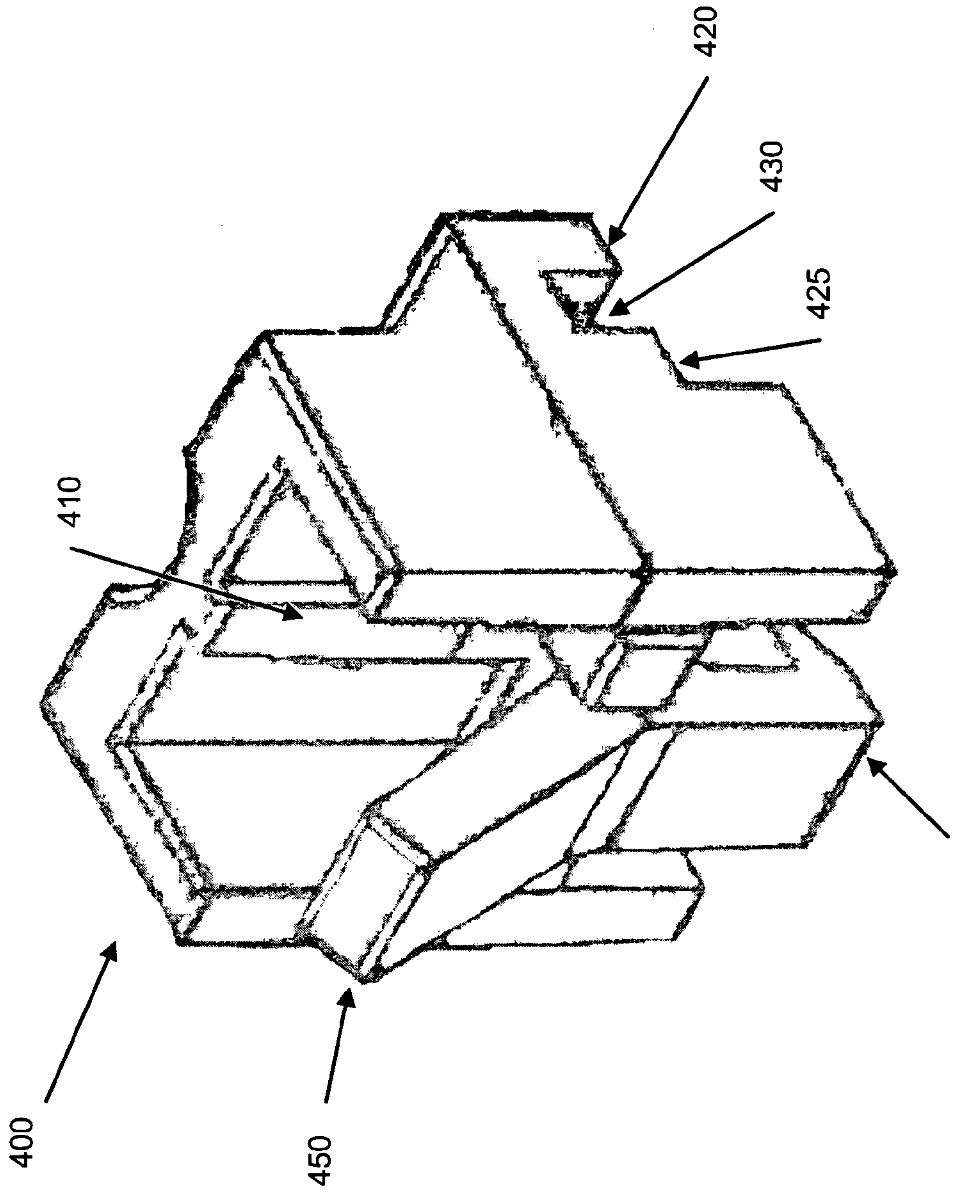
FIG. 4 is a perspective view of an exemplary clasp assembly associated with the securing device in accordance with an exemplary embodiment shown in FIG. 2.

As illustrated in more detail in FIG. 4, the clasp assembly 400 includes a main opening 410 dimensioned to receive the arm 320 of the base unit 300. On a side of the clasp assembly opposite to the main opening 410, laterally-extending shoulders 420 and 425 project from the clasp to form a recess 430, within which the upper edge of a card is positioned. A pawl 440 extends into the interior of the main opening 410 of the clasp assembly 400, such that when the clasp assembly 400 is slid onto the arm 320, the pawl 440 and teeth 360 engage in a ratchet-like fashion. In accordance with one embodiment, the teeth 360 can be angled in a downward fashion to permit the pawl to more securely attach to the teeth. A release tab 450 extends from the clasp assembly, which when depressed (i.e., moved toward the main opening 410), moves the pawl 440 out from an engagement with the teeth 360 of the arm 320, to enable the free upward movement of the clasp on the arm.

To secure a card in a socket using the embodiment of the invention described above with regard to FIGS. 2-4, the base 300 of the securing device is placed over the socket and forced downward until the pawls of the tabs 330, 330', 335, 335', 340 and 340' engage the lower edge of the socket 140 in order to retain the base of the securing device around the socket 140. In this position, the foundation 310 surrounds the periphery of the socket and the arm 320 extends orthogonally from the foundation 310. The circuit board to be secured is then attached to the socket in a conventional manner. The arm 310 now extends along the side of the circuit board to be secured. The clasp assembly 400 is positioned on the arm 720 and pushed downwards thereon until the upper edge of the card is securely positioned within the recess 430 of the clasp assembly 400. To loosen the device, the clasp assembly 400 is moved upward while depressing the release tab 450. Advantageously, only one finger is needed to actuate the release tab 450. Moreover, the size of the recess 430 can be easily varied during manufacture to accommodate circuit boards of various thicknesses.

In accordance with another exemplary embodiment of the present invention as illustrated in FIG. 5, the securing device can include a base unit 500 with an orthogonally extending arm 510*a*, and an additional orthogonally extending arm 520*b* including teeth 520 as well as an additional clasp assembly (not shown, but discussed with regard to FIG. 4 above). Otherwise, the remaining parts of the base unit 500 are the same as described above with regard to FIG. 3. The additional arm 520*b* and associated clasp assembly provide an additional manner of securing the card.

Figure 6:
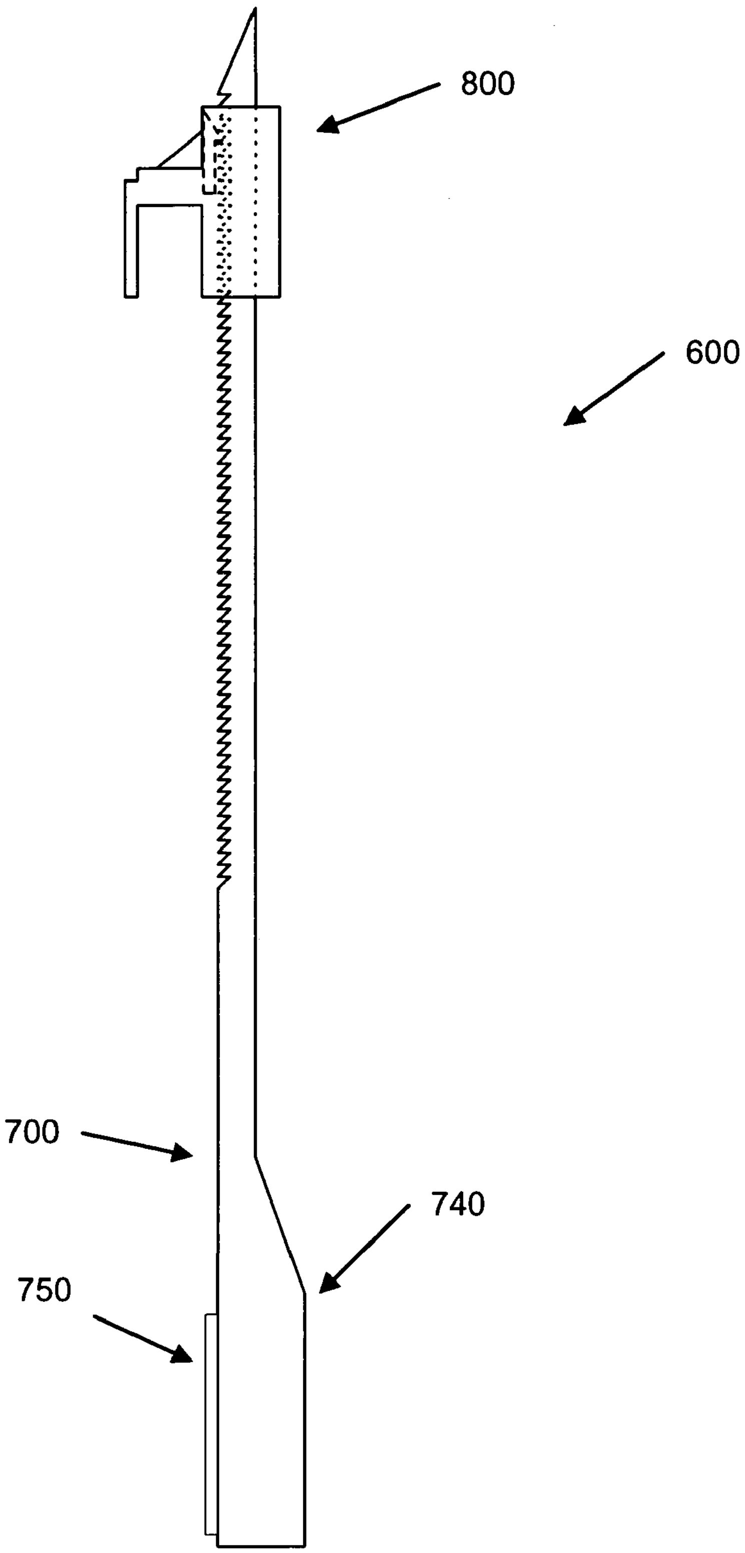
FIG. 6 is a end view of a securing device in accordance with yet another exemplary embodiment of the invention.

FIG. 6 illustrates an end view of another securing device 600 in accordance with another exemplary embodiment of the invention. The securing device 600 includes of a base unit 700 and a clasp assembly 800 that is removable and repositionable. As discussed above with regard to the previous exemplary embodiments, the unitary securing device 600 can be made of any sturdy material such as plastic (e.g., PVC material) or the like, so long as the material does not adversely affect the normal electrical operation of the circuit board and computer.

Figure 7:
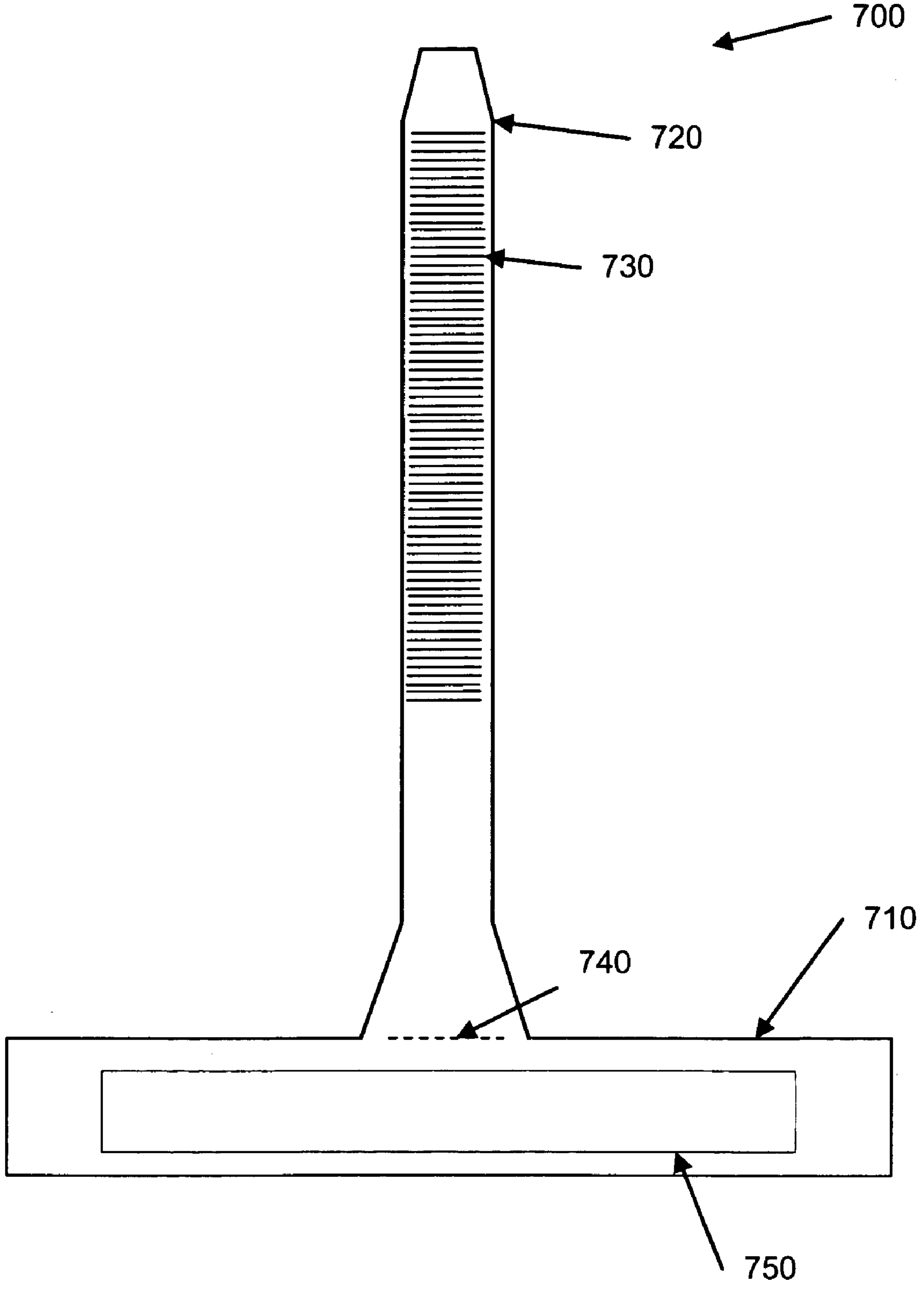
FIG. 7 is view of the base unit of the securing device illustrated in FIG. 6 in accordance with the present invention.

As illustrated in more detail in FIG. 7, the base unit 700 includes a foundation 710 and an orthogonally extending arm 720 attached to the foundation 710. The foundation and the arm are a unitary component. The orthogonally extending arm 720 includes a plurality of teeth 730 extending horizontally across at least part of the orthogonally extending arm 720 in a vertical direction for reception and interlocking with the clasp assembly 800. The foundation 310 includes an affixing element 750 (also shown in FIG. 6) for securing the device to a socket 130. The affixing element 750 can include adhesives such as glue or epoxy as well as adhesive pads and the like. On the side opposite to the affixing element, a ridge 740 (shown in broken line) is formed at the juncture of the arm 720 and the foundation 710, which facilitates the quick and easy orthogonal positioning on the side edge of a card socket.

Figure 8A:
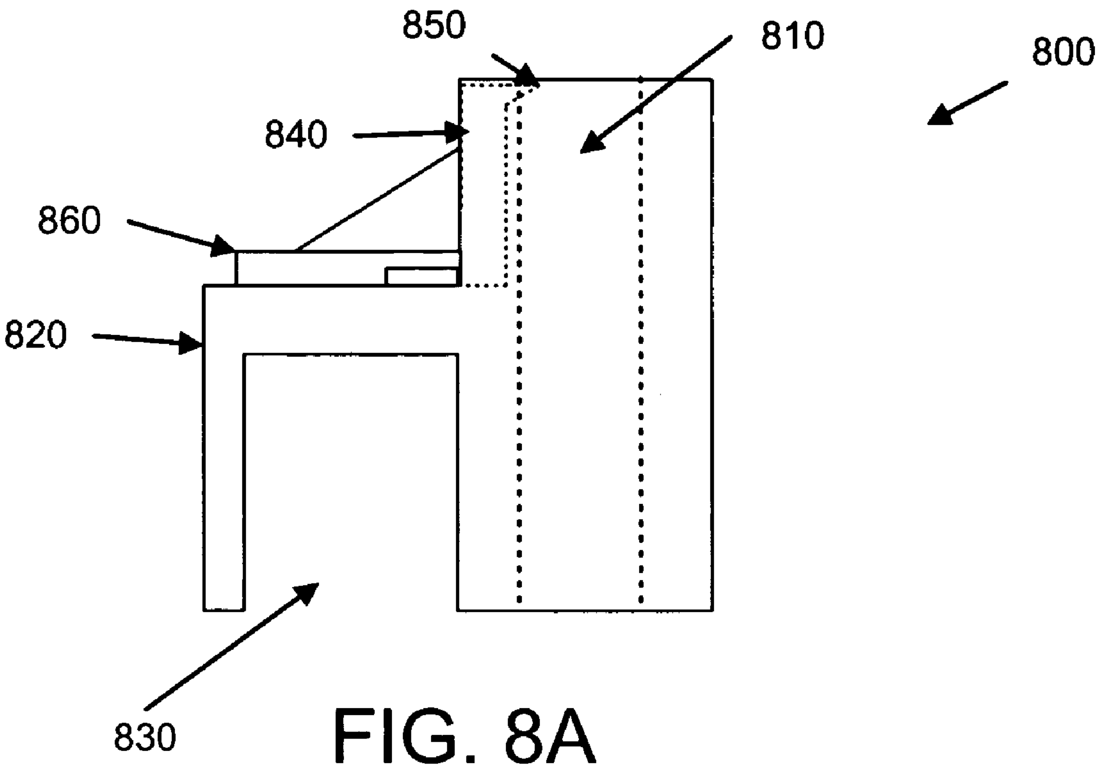
FIGS. 8A and 8B are side and front views, respectively, of the clasp assembly of the securing device illustrated in FIG. 6 of the present invention.
Figure 8B:
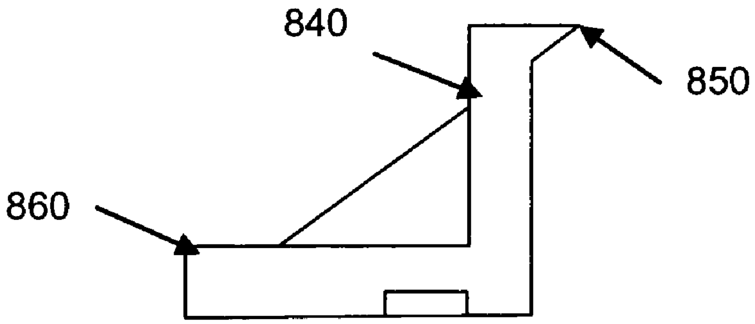

As illustrated in more detail in FIGS. 8A and 8B, the clasp assembly 800 includes a main opening 810 dimensioned to receive the arm 720. Laterally-extending shoulder 820 projects from the clasp assembly 800 to form a recess 830, within which the upper edge of a card is positioned. A pawl 840 extends into the interior of the main opening of the clasp assembly, such that when the clasp assembly is slid onto the arm 720, an end 850 of the pawl 840 and teeth 730 engage in a ratchet-like fashion. A release tab 860, which can be the opposite end of the pawl 840, when depressed, moves the pawl 840 out from an engagement with the teeth 730 of the arm 720, so as to enable the free movement of the clasp 800 on the arm.

To secure a card in a socket using the securing device 600 of the present invention, the securing device 700 is adhesively affixed the base of the connector within which a card is positioned. Note that the card can also be placed into the socket after installation of the securing device 700. The ridge 740 at the juncture of the foundation 710 and the orthogonally extending arm 720 are horizontally aligned with the upper edge of the connector to orthogonally position the card holder relative to the slot. In this position, the arm 720 extends orthogonally along the side of the card to be secured. The clasp assembly 800 is next positioned on the arm 720 and pushed downwards thereon until the upper edge of the card is securely positioned within the socket. To loosen the device, the clasp assembly 800 is moved upward while depressing the release tab 860. Advantageously, only one finger is needed to actuate the release tab 860. Moreover, the size of the recess 830 can be easily varied during manufacture to accommodate circuit boards of various thicknesses.

Figure 9:
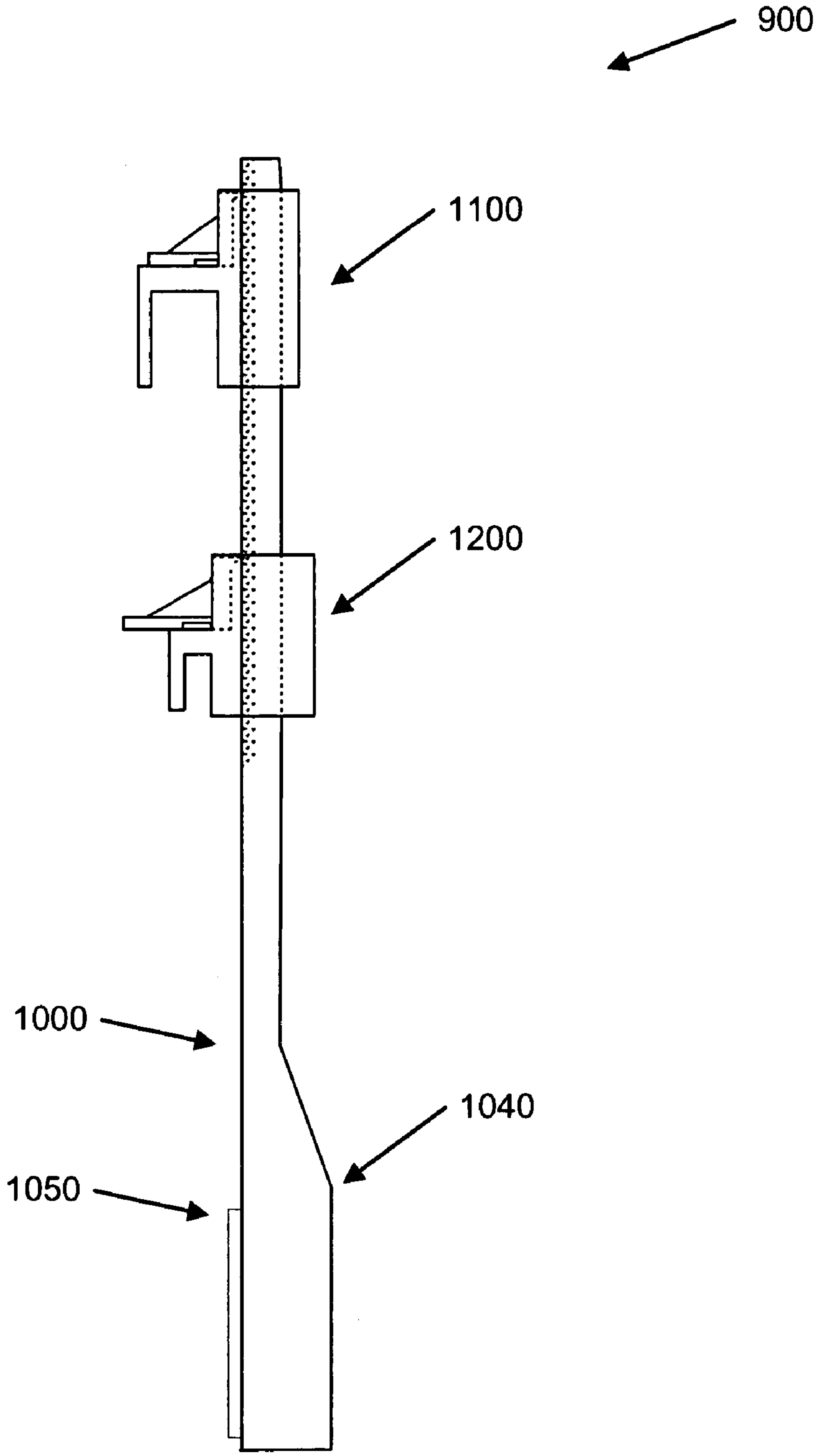
FIG. 9 is an end view of a securing device in accordance with yet another exemplary embodiment of the invention.

FIGS. 9-12 provide yet another exemplary embodiment of the present invention. FIG. 9 illustrates a side view of a securing device 900 that includes of a base unit 1000 and a plurality of clasp assemblies 1100 and 1200 that are each individually removable and repositionable. The clasp assemblies can be configured to fit on various cards. For example, clasp assembly 1100 is configured to receive a connector such as the connector 130' and 170 of FIG. 1B. As discussed above with regard to the previous exemplary embodiments, the unitary securing device 900 can be made of any sturdy material such as plastic (e.g., PVC material) or the like, so long as the material does not adversely affect the normal electrical operation of the circuit board and computer.

Figure 10:
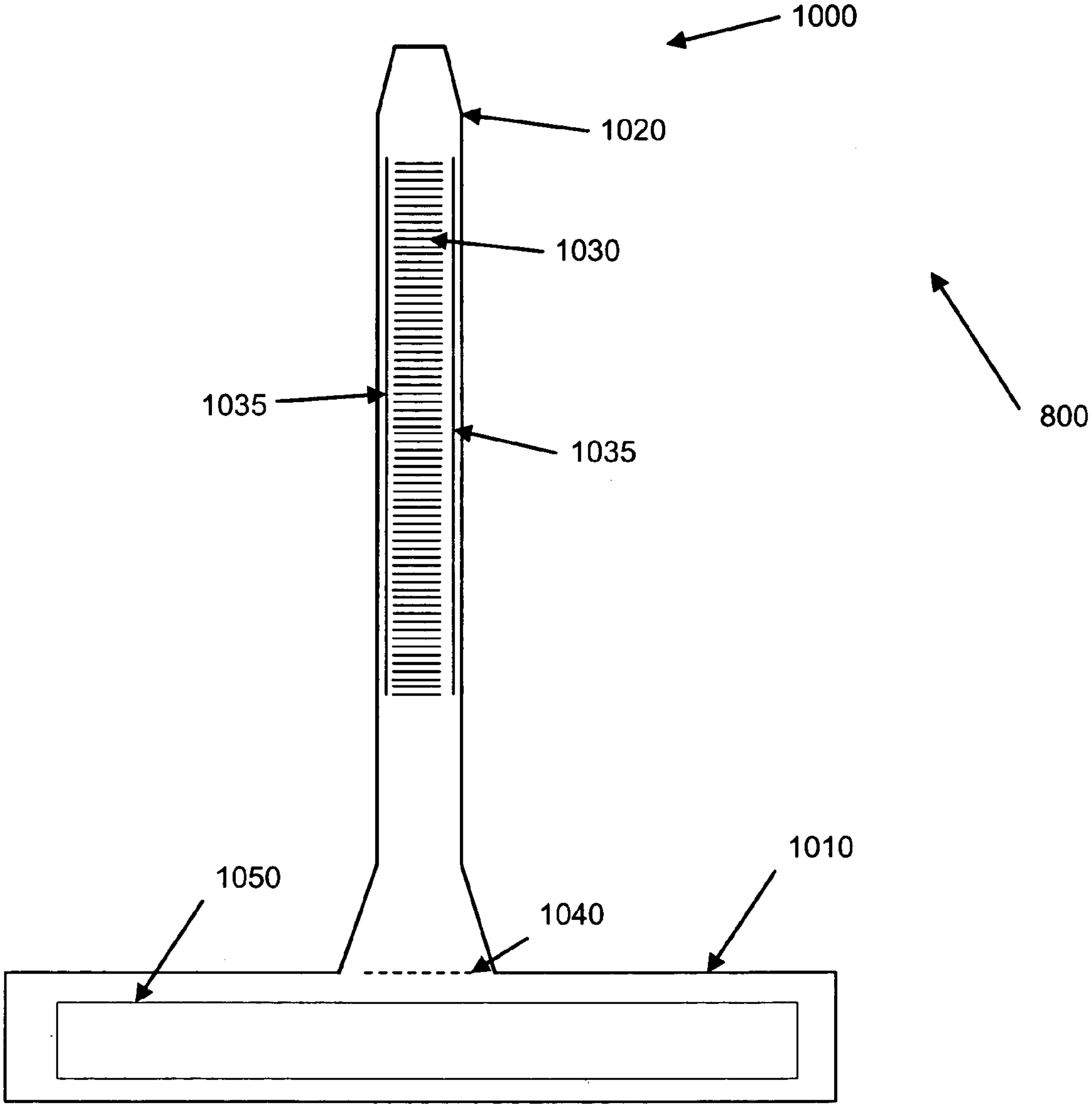
FIG. 10 is a view of the base unit of the securing device illustrated in FIG. 9 in accordance with the present invention.

As illustrated in more detail in FIG. 10, the base unit 1000 includes a foundation 1010 and an orthogonally extending arm 1020 attached to the foundation 1010. The foundation and the arm are a unitary component. The orthogonally extending arm 1020 includes a plurality of teeth 1030 extending horizontally across the orthogonally extending arm 1020 in a vertical direction for reception and interlocking with the clasp assembly 800. However, as opposed to the previous embodiment, the set of teeth are set within the extending arm and do not extend completely from one end to the other end of the arm 1020. Instead, the teeth are bounded by a wall 1035 in place in the orthogonally extending arm 1020. In other words, the teeth in accordance with the present invention, reside inside the structure of the orthogonally extending arm 1020 of the base unit 1000. The foundation 1010 includes, on the same side as the teeth 1030, an affixing element 1050 (also shown in FIG. 9) for securing the device to a socket 130. The affixing element 1050 can include adhesives such as glue or epoxy as well as adhesive pads and the like. On the side opposite to the affixing element 1050, a ridge 1040 (shown in broken line) is formed at the juncture of the arm 1020 and the foundation 1010, which facilitates the quick and easy orthogonal positioning on the side edge of the socket.

Figure 11A:
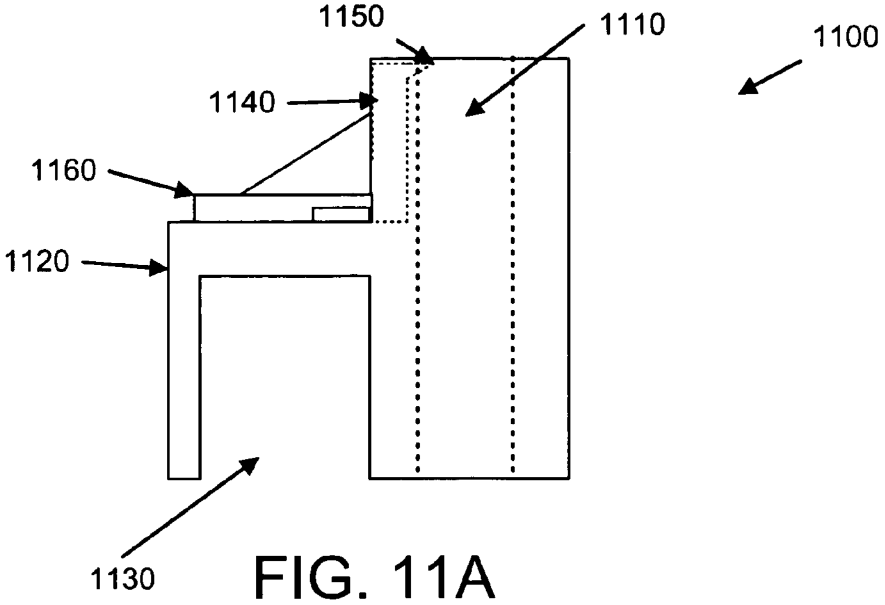
FIGS. 11A and 11B are side views of a clasp assembly and release tab assembly of the clasp assembly of the securing device illustrated in FIG. 9 of the present invention.
Figure 11B:
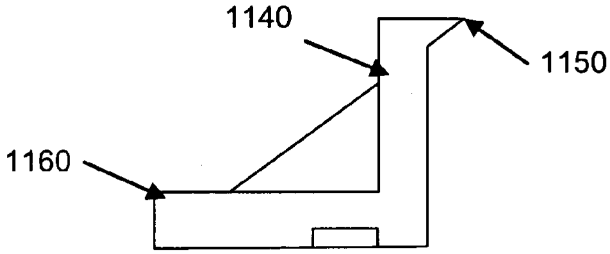
Figure 11C:
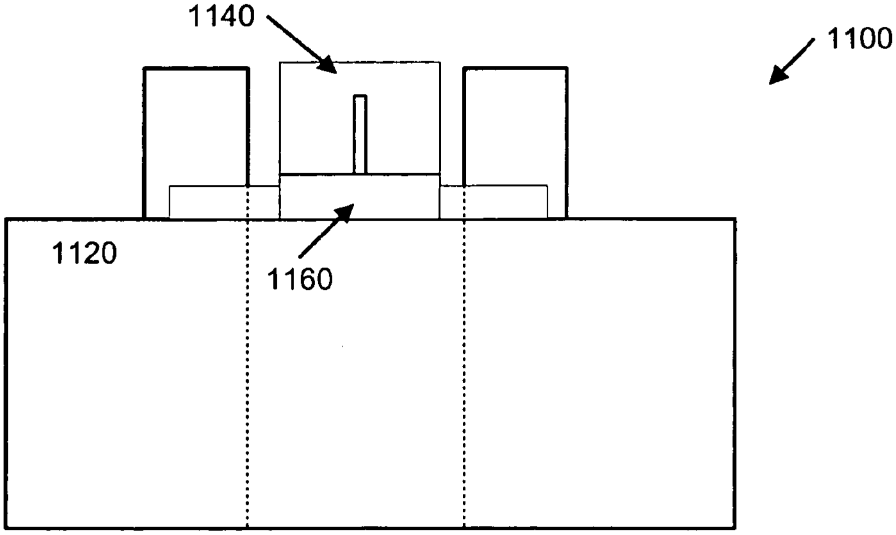
FIG. 11C is another view of the a clasp assembly illustrated in FIG. 11A of the present invention.

As illustrated in more detail in FIGS. 11A, 11B and 11C the clasp assembly 1100 (identical to the clasp 800 shown in FIGS. 8A and 8B) includes a main opening 1110 dimensioned to receive the arm 1020. Laterally-extending shoulder 1120 project from the clasp assembly 1100 to form a recess 1130, within which the upper edge of a card is positioned. The recess in the clasp 1100 is efficiently able to fit over a circuit board as well as any component (i.e., connector 130' of FIG. 1B) located near the top of the circuit board. A pawl 1140 (also shown from the side in FIG. 11B) extends into the interior of the main opening of the clasp assembly such that, when the clasp assembly is slid onto the arm 1020, an end 1150 of the pawl 1140 and teeth 1030 engage in a ratchet-like fashion. A release tab 1160, which can be the opposite end of the pawl 1140, when depressed into an opening in the laterally extending shoulder 1120, pivots and moves the pawl 1140 out from an engagement with the teeth 1030 of the arm 1020, so as to enable the free upward movement of the clasp 1100 on the arm. FIG. 11C illustrates a front view of the clasp assembly 1100.

Figure 12A:
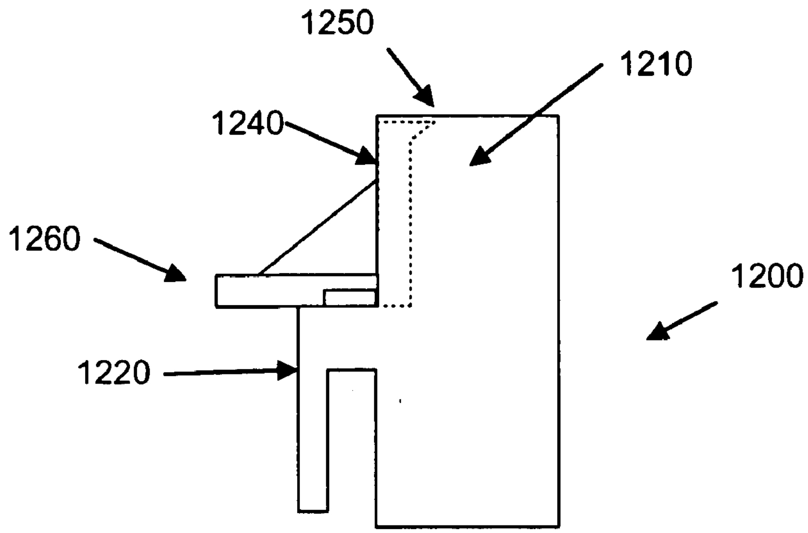
FIGS. 12A and 12B are views, of a second clasp assembly of the securing device illustrated in FIG. 9 of the present invention.
Figure 12B:
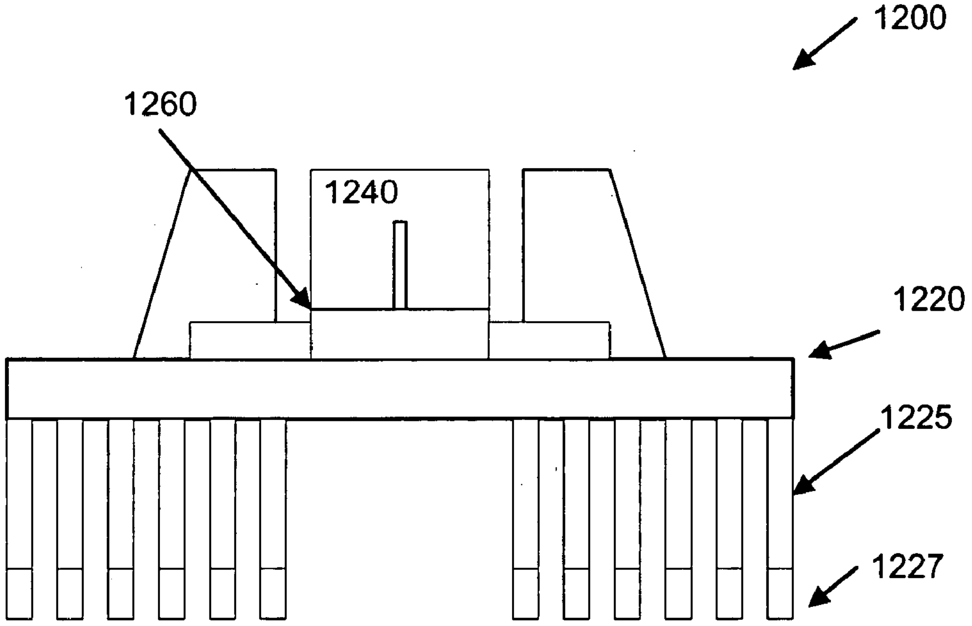

As illustrated in more detail in FIGS. 12A and 12B, the clasp assembly 1200 includes a main opening 1210 dimensioned to receive the arm 1020. Laterally-extending shoulder 1220 project from the clasp assembly 1200 to form a recess 1230, within which the upper edge of a card is positioned. A pawl 1240 extends into the interior of the main opening of the clasp assembly, such that when the clasp assembly is slid onto the arm 1020, an end 1250 of the pawl 1240 and teeth 1030 engage in a ratchet-like fashion. A release tab 1250, which can be the opposite end of the pawl 1240, when depressed, pivots moves the pawl 1240 out from an engagement with the teeth 1030 of the arm 1020, so as to enable the free upward movement of the clasp 1200 on the arm.

When viewed from the front as illustrated in FIG. 12B, the clasp assembly is structurally different from the clasp assemblies previously discussed. Instead of a structurally uniform shoulder 1220, the clasp assembly 1200 employs a rake-like shoulder with individual front finger elements 1225 and rear finger elements 1227 that form recess 1230 and help restrain movement of a circuit card assembly inserted into the recess.

To secure a card in a socket using the securing device 900 of the present invention, the securing device 900 is adhesively affixed the base of the connector within which a card is positioned. Note that the card can also be placed into the socket after installation of the securing device 900. The ridge 1040 at the juncture of the foundation 1010 and the orthogonally extending arm 720 are horizontally aligned with the upper edge of the connector to orthogonally position the card holder relative to the slot. In this position, the arm 1020 extends orthogonally along the side of the card to be secured. Either of the clasp assemblies 1100 or 1200 is next positioned on the arm 920 depending upon the size of the circuit card, and pushed downwards thereon until the upper edge of the card is securely positioned within the socket. To loosen the device, either of the clasp assemblies 1100 or 1200 is moved upward while depressing the release tab 1160 or 1260. The size of the card recess is variable to accommodate cards of various thicknesses.

It is, therefore, apparent that there has been provided, in accordance with the present invention, a device for securing a circuit board to a socket in a computer. While this invention has been described in conjunction with a number of illustrative embodiments, it is evident that many alternatives, modifications, and variations would be or are apparent to those of ordinary skill in the applicable arts. Accordingly, the disclosure is intended to embrace all such alternatives, modifications, equivalents and variations that are within in the spirit and scope of this invention.

What is claimed is:

1. A securing device for securing a card to a socket within a computer wherein the card and the socket are communicatively coupled, said device comprising:

a unitary base member comprising a foundation portion dimensioned to receive a stationary socket and an arm portion orthogonally positioned relative to said foundation, wherein a first engaging means is formed on at least one side of said arm member, and said foundation portion is elongated relative the arm along a width direction of the at least one side; and a clasp assembly comprising an opening for slideably receiving the arm portion of said unitary base member, a recess for receiving a non-connecting end of a card, and a second engaging means for securely engaging said first engaging means, wherein said clasp assembly secures said card to said socket with said socket received in the foundation and edge of said card is received in said recess.

2. The device of claim 1, wherein the first engaging means is plurality of vertically extending teeth.

3. The device of claim 2, wherein the second engaging means is a pawl.

4. The securing device of claim 3, wherein said pawl is released from said teeth by applying downward force a release tab located on the clasp assembly.

5. The device of claim 2, wherein the teeth are located on a flat portion of the unitary base member.

6. The securing device of claim 1, wherein the clasp assembly is removable.

7. The securing device of claim 1, wherein the unitary base member comprises a second arm portion orthogonally positioned relative to said foundation, wherein teeth are formed on at least one side of said second arm member.

8. The device of claim 7, further comprising:

a second clasp assembly comprising an opening for slideably receiving the second arm portion of said unitary base member.

9. A securing device for securing a card to a socket within a computer wherein the card and the socket are communicatively coupled, said device comprising:

a unitary base member comprising a foundation portion dimensioned to receive a stationary socket and an arm portion orthogonally positioned relative to said foundation, wherein a first engaging means is formed on at least one side of said arm member;

a sizing portion coupled to the foundation portion of the unitary base member to enable the foundation portion to receive different sized sockets; and a clasp assembly comprising an opening for slideably receiving the arm portion of said unitary base member, a recess for receiving a non-connecting end of a card, and a second engaging means for securely engaging said first engaging means, wherein said clasp assembly secures said card to said socket with said socket received in the foundation and edge of said card is received in said recess.

10. A securing device for securing a card to a socket within a computer wherein the card and the socket are communicatively coupled, said device comprising:

a unitary base member comprising a foundation portion dimensioned to receive a stationary socket and an arm portion orthogonally positioned relative to said foundation, wherein a first engaging means is formed on at least one side of said arm member and the foundation portion includes a base retaining tab for securing the base of the securing device to the socket; and a clasp assembly comprising an opening for slideably receiving the arm portion of said unitary base member, a recess for receiving a non-connecting end of a card, and a second engaging means for securely engaging said first engaging means, wherein said clasp assembly secures said card to said socket with said socket received in the foundation and edge of said card is received in said recess.

11. A securing device for securing a card to a socket within a computer wherein the card and the socket are communicatively coupled, said device comprising:

a unitary base member comprising a foundation portion and an arm portion orthogonally positioned relative to said foundation, wherein a first engaging means is formed on at least one side of said arm member;

an affixing element to attach the foundation portion of the unitary base member to the socket; and a clasp assembly comprising an opening for slideably receiving the arm portion of said unitary base member, a recess for receiving a non-connecting end of a card, and a second engaging means for securely engaging said first engaging means, wherein said clasp assembly secures said card to said socket with said socket attached to the foundation portion and edge of said card is received in said recess.

12. The device of claim 11, wherein the first engaging means is plurality of vertically extending teeth.

13. The device of claim 12, wherein the second engaging means is a pawl.

14. The securing device of claim 13, wherein said pawl is released from said teeth by applying downward force to said tab member.

15. The device of claim 12, wherein the teeth are located on a flat portion of the unitary base member.

16. The securing device of claim 11, wherein the teeth are formed on the side opposite the affixing element.

17. The securing device of claim 11 further comprising:

a ridge, formed at the juncture of the arm and the foundation, which facilitates orthogonal positioning of the securing device on the side edge of a socket.

18. The securing device of claim 11, wherein the clasp is removable from the unitary base member.

19. The securing device of claim 11, wherein the affixing element is an adhesive pad.

20. The securing device of claim 11, wherein the affixing element is an adhesive.

21. The device of claim 11, wherein the foundation portion is elongated orthogonally relative to a direction in which the arm extends.

22. An article of manufacture, comprising:

a unitary base member comprising a foundation portion and an arm portion orthogonally positioned relative to said foundation, wherein a first engaging means is formed on at least one side of said arm member;

an affixing element to attach the foundation portion of the unitary base member to a socket; and a plurality of clasp assemblies, each said assembly comprising an opening for slideably receiving the arm portion of said unitary base member and a second engaging means for securely engaging said first engaging means, wherein said clasp assemblies attach to the unitary base member.

23. The device of claim 22, wherein the first engaging means is plurality of vertically extending teeth.

24. The device of claim 23, wherein the second engaging means is a pawl.

25. The device of claim 21, wherein the teeth are located on a flat portion of the unitary base member.

26. The device of claim 21, wherein the clasp assemblies have different sized openings.

27. The device of claim 22, wherein the foundation portion is elongated orthogonally relative to a direction in which the arm extends.

28. The device of claim 22, further comprising a ridge, formed at the juncture of the arm and the foundation portion, wherein said ridge facilitates orthogonal positioning of the arm relative to a socket when attaching the device to the socket.

* * * * *